(12) United States Patent
Suvorov

(10) Patent No.: US 8,080,441 B2
(45) Date of Patent: Dec. 20, 2011

(54) GROWING POLYGONAL CARBON FROM PHOTORESIST

(75) Inventor: Alexander Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 12/686,066

(22) Filed: Jan. 12, 2010

(65) Prior Publication Data

US 2011/0169013 A1 Jul. 14, 2011

(51) Int. Cl.
*H01L 51/40* (2006.01)
(52) U.S. Cl. .......... 438/99; 438/142; 438/149; 438/478; 257/E21.049; 257/E21.04
(58) Field of Classification Search .......... 438/99, 438/142, 455, 458, 459, 478, 781, 800; 257/E21.04, 257/E21.041, E21.054, E39.007, E51.038–E51.04, 257/E23.165
See application file for complete search history.

(56) References Cited

U.S. PATENT DOCUMENTS

| | | | | |
|---|---|---|---|---|
| 6,083,624 | A * | 7/2000 | Hiura | 428/408 |
| 6,156,256 | A * | 12/2000 | Kennel | 264/461 |
| 6,221,703 | B1 | 4/2001 | Liu et al. | |
| 7,015,142 | B2 * | 3/2006 | DeHeer et al. | 438/689 |
| 7,071,258 | B1 * | 7/2006 | Jang et al. | 524/496 |
| 7,327,000 | B2 * | 2/2008 | DeHeer et al. | 257/359 |
| 7,476,594 | B2 * | 1/2009 | Suvorov | 438/407 |
| 7,687,308 | B2 * | 3/2010 | Parikh et al. | 438/99 |
| 7,732,859 | B2 * | 6/2010 | Anderson et al. | 257/328 |
| 2006/0099135 | A1 * | 5/2006 | Yodh et al. | 423/447.1 |
| 2006/0115640 | A1 * | 6/2006 | Yodh et al. | 428/221 |
| 2006/0226482 | A1 * | 10/2006 | Suvorov | 257/347 |
| 2007/0161213 | A1 * | 7/2007 | Hiura et al. | 438/478 |
| 2007/0287011 | A1 * | 12/2007 | DeHeer | 428/411.1 |
| 2009/0236608 | A1 * | 9/2009 | de Heer et al. | 257/77 |
| 2009/0236609 | A1 * | 9/2009 | de Heer et al. | 257/77 |
| 2009/0252886 | A1 * | 10/2009 | Barker et al. | 427/523 |
| 2010/0038627 | A1 * | 2/2010 | Parikh et al. | 257/24 |
| 2010/0133512 | A1 * | 6/2010 | Parikh et al. | 257/24 |

OTHER PUBLICATIONS

Berger, Claire et al, Ultrathin epitaxial graphite: 2D electron gas properties and a route toward graphene-based nanoelectronics. J. Phys. Chem. B, 2004, 108 (52), pp. 19912-19916 [5 pages].

Calizo, Irene et al, Ultraviolet Raman microscopy of single and multilayer graphene, Journal of Applied Physics 106, Issue 4, pp. 043509-043509-5, 2009 [5 pages].

(Continued)

*Primary Examiner* — Alexander Ghyka
*Assistant Examiner* — Leonard Chang
(74) *Attorney, Agent, or Firm* — Steven B. Phillips; Moore & Van Allen PLLC

(57) ABSTRACT

A method of growing polygonal carbon from photoresist and resulting structures are disclosed. Embodiments of the invention provide a way to produce polygonal carbon, such as graphene, by energizing semiconductor photoresist. The polygonal carbon can then be used for conductive paths in a finished semiconductor device, to replace the channel layers in MOSFET devices on a silicon carbide base, or any other purpose for which graphene or graphene-like carbon material formed on a substrate is suited. In some embodiments, the photoresist layer forms both the polygonal carbon layer and an amorphous carbon layer over the polygonal carbon layer, and the amorphous carbon layer is removed to leave the polygonal carbon on the substrate.

22 Claims, 5 Drawing Sheets

OTHER PUBLICATIONS

De Heer, Walt A. et al, Epitaxial graphene, (Preprint submitted to Solid State Communications), Feb. 1, 2008 (pp. 1-19). (see also—http://www.physics.gatech.edu/npeg/publications/DeHeerSSC07.pdf) [19 pages].

Gu, Gong et al, Field effect in epitaxial graphene on a silicon carbide substrate, Appl. Phys. Lett. 90, 253507 (2007) [13 pages].

Kim, Seungchul et al, Origins of anomalous electronic structures of epitaxial graphene on silicon carbide, Phys. Rev. Lett. 100, 176802 (2008) [4 pages].

Moon, J.S. et al, Epitaxial-Graphene RF Field-Effect Transistors on Si-Face 6H-SiC Substrates, IEEE Electron Device Letters, vol. 30, Issue No. 6, Jun. 2009 (pp. 650-652) [3 pages].

* cited by examiner

GROWING POLYGONAL CARBON FROM PHOTORESIST

BACKGROUND

Graphene is a one-atom thick layer of carbon atoms forming six-membered rings. Graphene and graphene-like substances may be referred to collectively as polygonal carbons. Graphene has many potential uses. It has excellent electromechanical properties and can be used as a supercapacitor. Measurements have shown that graphene has a breaking strength many times greater than steel. In addition to having high mechanical strength by itself, graphene can be used to make mechanically strong graphene-polymer composites. Graphene can also be used as a magnetic material, because the edges of graphene sheets have non-binding pi-electrons giving rise to edge states.

Polygonal carbons like graphene can also be used as building blocks of semiconductor devices. The pi-electrons discussed above can give such material electronic transport properties. Graphene has, for example, been found to be a one-dimensional ballistic conductor over micron-scale distances at room temperature. The advantages of graphene include very high current carrying ability, ballistic and coherent transport, and the fact that graphene structures can be either metallic or semiconducting. Properly nano-patterned graphene ribbons can serve as transparent wires to conduct electrical currents.

SUMMARY

Embodiments of the present invention provide a way to grow polygonal carbon such as graphene by energizing semiconductor photoresist. The polygonal carbon can then be used for conductive paths in a finished semiconductor device, to replace the channel layers in MOSFET devices on a silicon carbide base, or any other purpose for which graphene or graphene-like carbon material formed on a substrate is suited.

In some embodiments, the polygonal carbon is formed by providing a photoresist layer on a substrate. The photoresist layer is then energized until polygonal carbon is formed. In some embodiments, the photoresist layer forms a polygonal carbon layer or multiple polygonal carbon layers on the substrate and an amorphous carbon layer over the polygonal carbon. The amorphous carbon is removed to leave the polygonal carbon. In some embodiments, the energizing of the photoresist can be accomplished by heating and/or annealing. In some embodiments, the energizing of the photoresist can be accomplished by, or is aided by performing an ion implantation process on the photoresist layer. In such an embodiment, as an example, the ion implantation can take place prior to or during heating. In some embodiments the substrate is silicon carbide, which may be 6H or 4H silicon carbide. In some embodiments, the silicon carbide substrate is formed from a zero-degree silicon carbide wafer, which may be a wafer having either a (0001) or (000$^-$1) face with up to several degree off-angles.

In some embodiments, the energizing of the photoresist layer is accomplished at least in part by holding the semiconductor structure at a temperature of between about 1200 and about 2000 degrees C. for between about 10 and about 180 minutes. In some embodiments, the energizing may be accomplished at least in part by holding the structure at a temperature of between about 80 and about 120 degrees C. for between about 10 and about 20 minutes, and then at a temperature of between about 300 and about 700 degrees C. for between about 30 and about 120 minutes prior to holding the structure at the temperature of between about 1200 and about 2000 degrees C.

In some embodiments, metal contacts can be deposited on the substrate to form a semiconductor device in which the polygonal carbon layer provides device interconnects. In some embodiments, a gate can be deposited over at least a portion of the polygonal carbon layer, and a source and drain can be formed adjacent to the polygonal carbon layer. Metal contacts can then be deposited for the source, the drain, and the gate to form a field-effect semiconductor device.

In some embodiments, the above described techniques can be used to create a polygonal carbon layer on a substrate, such as a silicon carbide substrate. In some embodiments the above described techniques can be used to create a polygonal carbon layer on a silicon carbide layer bonded to a support substrate. A semiconductor structure in an embodiment with a support substrate can be formed by implanting nitrogen into a silicon carbide substrate to form a buried layer of silicon nitride defining a silicon carbide surface layer. A support substrate can be bonded to the silicon carbide surface layer. The silicon carbide surface layer can then be separated from the silicon carbide substrate and the silicon nitride to form the silicon carbide layer bonded to the support substrate. Polygonal carbon such as graphene can then be formed on the silicon carbide layer using photoresist in the manner described above. In some embodiments, separating the silicon carbide surface layer from the silicon carbide substrate and the silicon nitride can be accomplished by contacting the semiconductor structure with an etchant. In some embodiments, phosphoric acid can be used as the etchant while holding the semiconductor structure at an elevated temperature.

BRIEF DESCRIPTION OF THE DRAWINGS

FIG. 2E is a side view. FIGS. 2A-2D and FIG. 2F are top views.

DETAILED DESCRIPTION

Figure 1A:
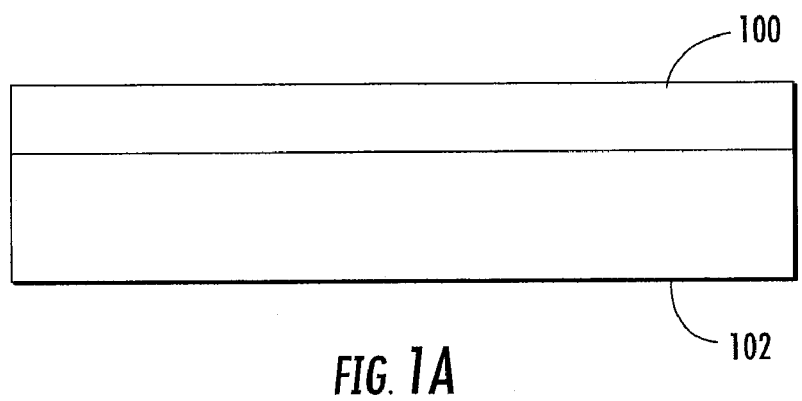
FIGS. 1A through 1E are side view schematic diagrams illustrating polygonal carbon formation according to example embodiments of the present invention.

The following detailed description of embodiments refers to the accompanying drawings, which illustrate specific embodiments of the invention. Other embodiments having different structures and operation do not depart from the scope of the present invention.

It should be noted that polygonal carbon as referred to herein can include graphene or any graphene-like, thin, carbon-based sheets. Such a polygonal carbon layer may, for example, be composed of imperfect graphene, that is graphene where at least some of the carbon atoms do not form perfect rings, or at least some of the rings are broken or do not connect perfectly. For purposes of this disclosure, any reference to graphene can be assumed to be a reference being made as an example only, and likewise any embodiments described in terms of producing graphene should be considered examples only.

As previously mentioned, embodiments of the present invention provide a way to produce polygonal carbon layers from photoresist. Photoresists are important in electronics, and are used to manufacture both circuit boards and semiconductor devices. Photoresists are polymeric coatings that are designed to change properties upon exposure to light. After exposure, either the exposed or the unexposed regions can be selectively removed to reveal material underneath. While typical exposure and etching procedures can be used to set up selective areas of photoresist for use in carrying out an embodiment of the present invention, embodiments of the invention rely on properties of photoresists that are not directly related to the how photoresists react to light.

There are many formulations for photoresists. Modern photoresists typically contain diazonaphthaquinone, phenolic polyol, and/or novolak resin. Photoresists typically contain carbon in one form or another. In embodiments of the present invention, this carbon is used to provide the atoms to form polygonal carbon. By using photoresist in this way, polygonal carbon sheets in specific patterns can be formed without etching. It is important to note that with an embodiment of the present invention, etching may be used to pattern the photoresist on the substrate, but etching would not typically be needed after the polygonal carbon is formed in order to pattern the polygonal carbon layers.

A large number of photoresists are available, where exact formulation of a photoresist is typically held as a trade secret by the manufacturer. However, photoresists that perform well when used with an embodiment of the present invention have been identified. In particular, AZ™ 7905 MIF Photoresist manufactured by Clariant Corporation of Summerville, N.J., USA, and Megaposit™ SPR™ 660 Series Photoresist manufactured by Rohm and Haas Company, Philadelphia, Pa., USA, have been found to be suitable for carrying out embodiments of the present invention. Many other photoresists will work as well.

It should be noted that the etching of a polygonal carbon layer, such as a graphene layer on a substrate, normally requires a strong etchant be applied for a significant time. With at least some semiconductor substrates, for example, silicon carbide, the required exposure to such an etchant also etches the substrate. Although the substrate can be protected, the process of etching graphene on the substrate can still leave small indentations and/or discontinuities in the surface of the substrate, especially near the edges of patterned features. Producing a semiconductor device with polygonal carbon features, but without etching the polygonal carbon, will with at least some embodiments of the present invention result in a device without these indentations and discontinuities in the surface of the substrate.

FIGS. 1A-1E show schematic cross-sectional views of a crystalline substrate going through a process according to an example embodiment of the invention, presenting the views at various points in the process. In this example embodiment, the crystalline substrate is 6H or 4H silicon carbide (6H—SiC, or 4H—SiC). Also in this example embodiment, a so-called "zero-degree" silicon carbide wafer is used. A zero-degree wafer is a wafer having either a (0001) or (000⁻1) face with up to several degree off-angles. The use of a zero-degree wafer can aid in the formation of a polygonal carbon sheet with a minimum of defects and/or discontinuities.

Figure 1B:
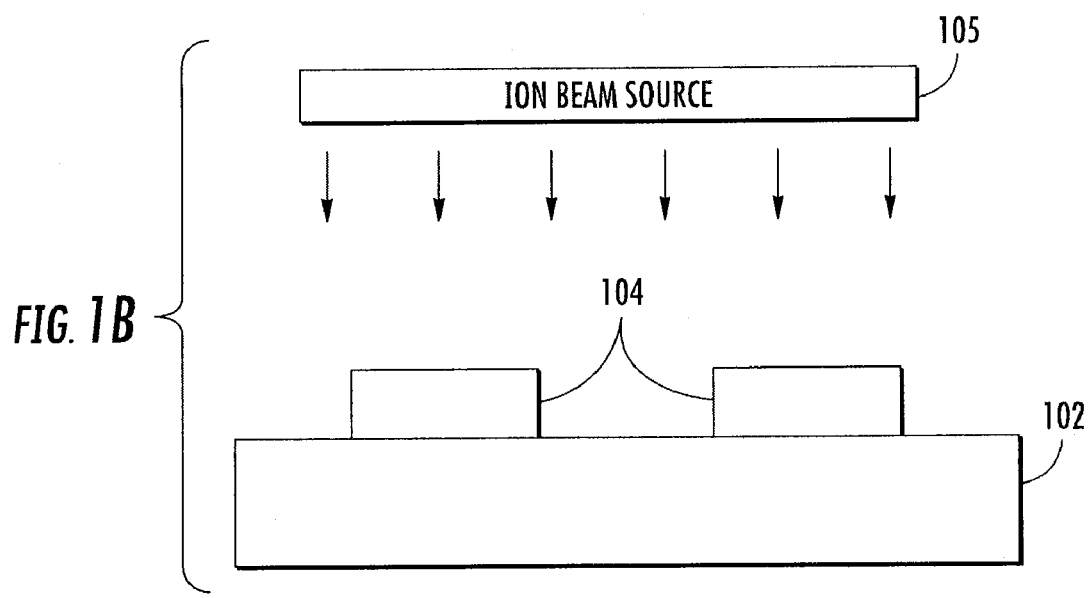
Figure 1C:
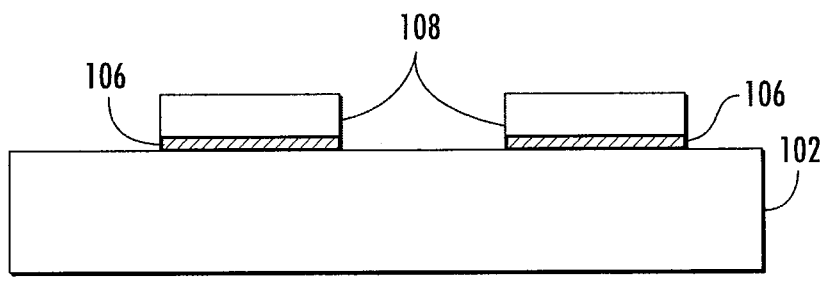
Figure 1D:
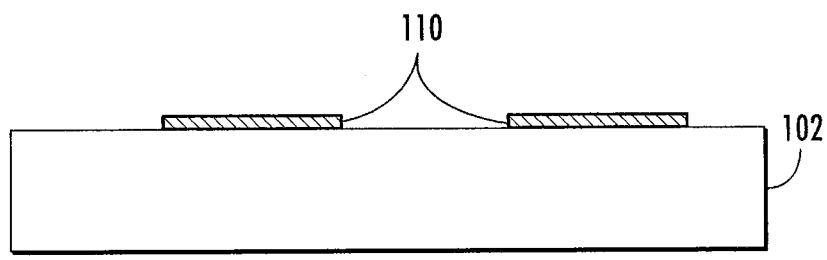
Figure 1E:
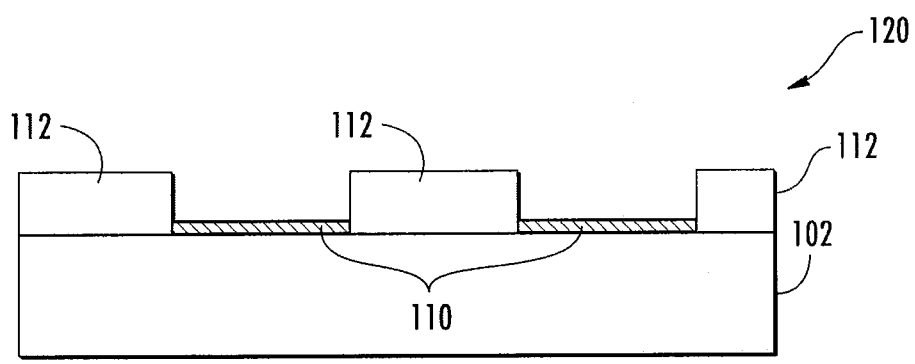

Turning to FIG. 1A, a photoresist layer 100 is deposited on the 4H—SiC substrate 102. The photoresist is then exposed and etched to provide selectively patterned photoresist 104 as shown in FIG. 1B. The structure is then heated. In this example embodiment, the structure is held at a temperature of about 1900 degrees C. for about 15 minutes, in a vacuum. These conditions are sufficient to energize the selectively patterned photoresist 104. The heating may cause annealing of the photoresist. Optionally, ion implantation can be carried out either in lieu of, before, or during the heating of the photoresist. Carbon can be used for the ion implantation. In some embodiments annealing in combination with carbon ion implantation can be used. In such an embodiment, the energy level of the carbon ions should be sufficient to decrease the concentration of oxygen, hydrogen and nitrogen in order to avoid interaction of these atoms with the surface of the substrate during annealing. In this case, ion beam source 105 directs carbon ions into the photoresist. An intermediate structure as shown in FIG. 1C results, and the intermediate structure consists of the substrate 102, and selectively patterned layers of epitaxial graphene, 106, with amorphous carbon, 108, on top of the epitaxial graphene. The epitaxial graphene may consist of one layer of graphene or multiple layers of graphene, although with multiple layers, it may be that only one layer actually conducts to enable operation of a finished device. The ion implantation can break or aid in breaking molecular bonds in compounds in the photoresist, so that an annealing process happens more quickly and/or the polygonal carbon epilayer is more complete.

Still referring to FIG. 1, the amorphous carbon 108 can be removed, for example, by exposure to oxygen plasma. The removal of the amorphous carbon results in the structure shown in FIG. 1D, with a patterned, graphene epilayer 110 on the SiC substrate 102. Finally, in FIG. 1E, metal contacts 112 can be deposited on the substrate 102 using any standard metal process to form a semiconductor device 120 in which epitaxial graphene layer 110 provides device interconnects. It should be noted that the selectively patterned polygonal carbon produced with embodiments of the invention can be grown in any of various configurations and designs as required for the specific finished device desired.

Figure 2A:
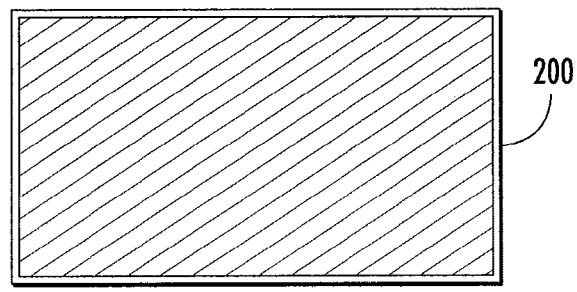
FIGS. 2A through 2F are schematic diagrams that illustrate the formation on a substrate of a transistor with a polygonal carbon channel according to some example embodiments of the invention.
Figure 2B:
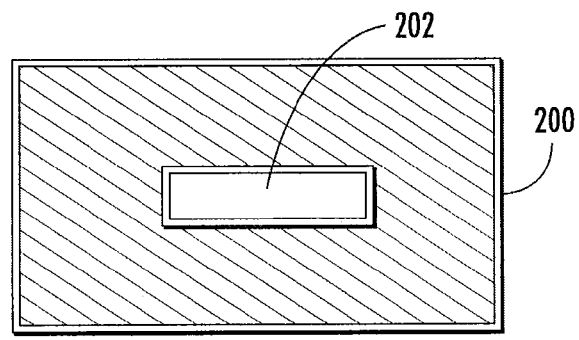

FIGS. 2A-2F show views of a structure going through a process to produce a field-effect semiconductor device such as a MOSFET, in which the channel is made up of graphene produced from photoresist as just described. Many such devices can be produced at once on a single substrate; however, only one is shown here for clarity. FIG. 2A shows a top view of substrate 200 according to an embodiment of the invention, onto which photoresist has been applied. In FIG. 2B, the photoresist has gone through a standard lithographic process and been etched so that a selective area of photoresist remains. The structure was then energized as previously described. Again, carbon ion implantation and/or heat could have been used. Amorphous carbon was then removed as previously described, leaving graphene epilayer 202 on substrate 200.

Figure 2C:
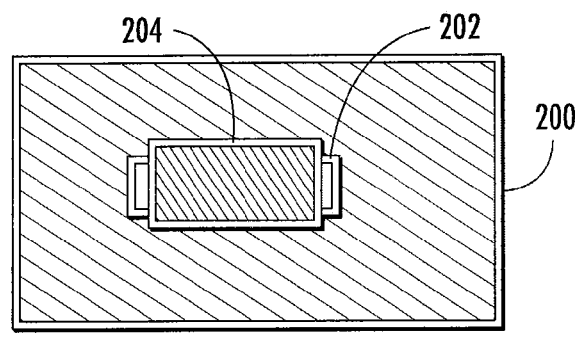
Figure 2D:
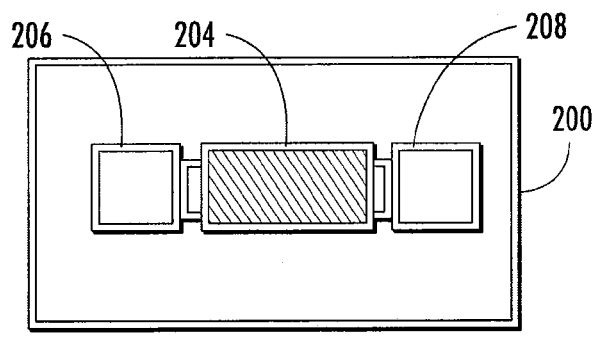
Figure 2E:
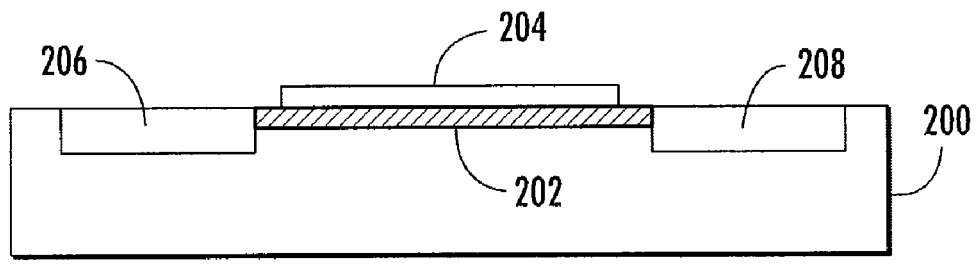
Figure 2F:
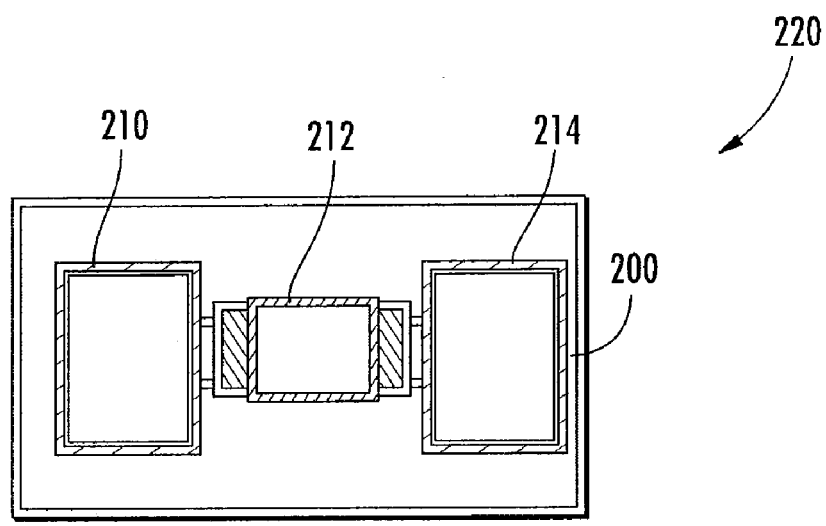

Referring to FIG. 2C, gate 204 has been deposited over the graphene. Gate 204 can be of a typical composition for gates, for example, metal oxide. In FIG. 2D, a source 206 and a drain 208 have been formed in the substrate adjacent to the graphene epilayer 202. A source and drain can be formed a number of ways, for example, by another standard ion implantation process. FIG. 2E shows a cross-sectional view of the device at the same stage as that shown in FIG. 2D. Finally, FIG. 2F shows a finished device 220, with metal contacts deposited over the source, gate and drain. Metal contact 210 is connected to the source, metal contact 212 is connected to the gate, and metal contact 214 is connected to the drain. It should be noted that the polygonal carbon formed as described thus far may consist of multiple atomic sheets. It is also possible that only a subset of those sheets will be conductive.

The energizing of the photoresist as discussed above can be accomplished with various heating techniques. In the specific example above, the structure is held at a temperature of about 1900 C for about 15 minutes. Temperatures from about 1200 C to about 2000 C for an appropriate amount of time between about 10 and about 180 minutes can work. With at least some photoresists under at least some conditions, a staged heating process can be used to more effectively produce polygonal carbon. For example, with some combinations of photoresist and conditions, good results can be achieved by holding the structure at a temperature between about 80 and about 120 degrees C. for from about 10 to about 20 minutes to anneal the photoresist, and then holding the structure at a temperature between about 300 and about 700 degrees C. for from about 30 to about 120 minutes prior to the final heating at about 1200 to about 2000 degrees C. for about 10 to about 180 minutes as described previously.

Silicon carbide substrates tend to suffer from separation of the carbon and silicon atoms into different regions of the substrate. Thus, it might be difficult to make a SiC substrate particularly thin if there is a desire to use the techniques discussed thus far herein to obtain polygonal carbon on a substantially thin mechanical support.

Figure 3A:
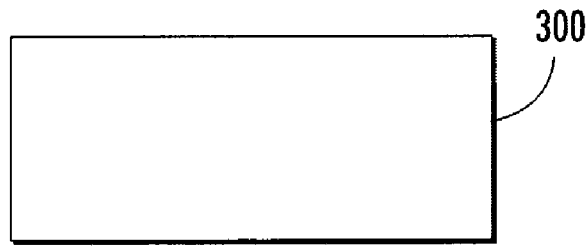
FIGS. 3A through 3D are side view schematic diagrams illustrating the production of a semiconductor structure having a polygonal carbon layer on a silicon carbide surface according to some example embodiments of the present invention.
Figure 3B:
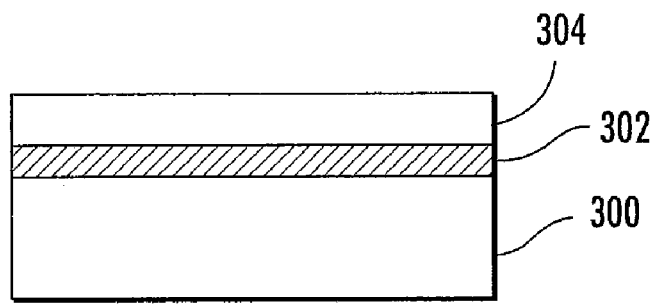

FIGS. 3A through 3D illustrate a semiconductor structure and the process of making the structure, wherein the polygonal carbon is formed as described herein on a substantially thin silicon carbide surface layer bonded to a support substrate. Bulk silicon carbide substrate 300 is illustrated in FIG. 3A. Again, a zero-degree or near zero-degree wafer may be used. As illustrated in FIG. 3B, atomic or molecular nitrogen is implanted into the substrate 300 to form a buried layer 302 of silicon nitride which defines a silicon carbide surface layer 304 above the buried insulating layer 302. The silicon nitride insulating layer 302 can be on the order of 1000 angstroms thick.

Figure 3C:
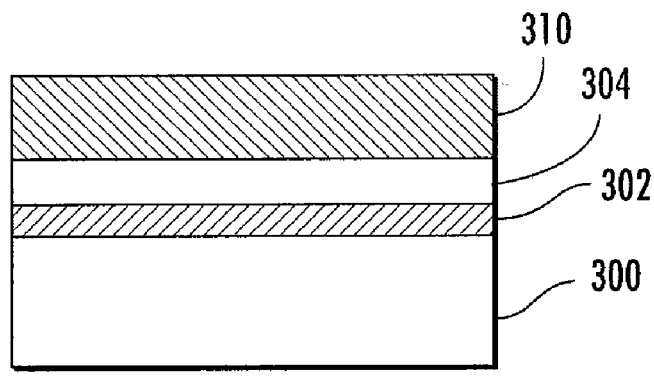

As illustrated in FIG. 3C, a support substrate 310 may be bonded to surface layer 304. Support substrate 310 may include silicon carbide, silicon, gallium arsenide, sapphire, copper, aluminum, alumina, aluminum nitride, or any other suitable material. Support substrate 310 may provide mechanical support for layer 304 when it is separated from the remainder of the structure. The support substrate may also provide electrical contact to layer 304. Layer 304 may be separated (i.e. removed or lifted-off) from layer 300 by contacting the wafer and the silicon nitride layer 302 with a composition (typically an etchant) that removes silicon nitride compositions but not silicon carbide. Phosphoric acid can be used as an etchant for this purpose, and etching with phosphoric acid is usually carried out at an elevated temperature, for example, 100-150 degrees C.

Figure 3D:
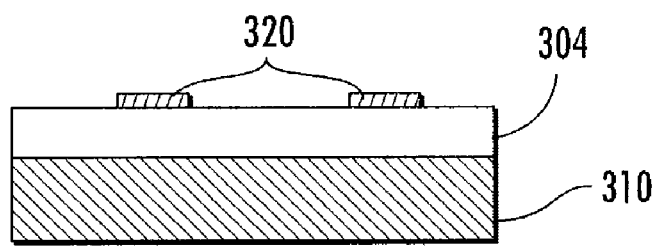

Still referring to FIGS. 3A through 3D, once the buried insulating layer 302 has been etched away and substrate 300 removed, graphene 320 can be formed from photoresist using one of the methods previously described, and the structure illustrated in FIG. 3D results, namely, a relatively thin silicon carbide layer 304 bonded to a support substrate 310, with an epitaxial layer of graphene 320 that may be used to form circuits or electronic devices. Further details on the portion of this process directed to forming the relatively or substantially thin silicon carbide layer bonded to a support substrate are disclosed in U.S. Pat. No. 7,476,594, the entire disclosure of which is incorporated herein by reference.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Additionally, comparative, quantitative terms such as "above", "below", "less", "greater", and/or "between", are intended to encompass the concept of equality, thus, "less" can mean not only "less" in the strictest mathematical sense, but also, "less than or equal to."

It should also be pointed out that references may be made throughout this disclosure to figures and descriptions using terms such as "top", "above", "beneath", "within", "on", and other terms which imply a relative position of a structure or portion. These terms are used merely for convenience and refer only to the relative position of features as shown from the perspective of the reader. An element that is placed or disposed atop another element in the context of this disclosure can be functionally in the same place in an actual product but be beside or below the other element relative to an observer due to the orientation of a device or equipment. Any discussions which use these terms are meant to encompass various possibilities for orientation and placement.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A method of forming a polygonal carbon layer, the method comprising:
   providing a photoresist layer on a substrate; and
   energizing the photoresist layer until the photoresist layer forms graphene or a graphene-like sheet.

2. The method of claim 1 further comprising removing an amorphous carbon layer formed by the energizing of the photoresist layer to leave the graphene or a graphene-like sheet.

3. The method of claim 2 wherein the energizing of the photoresist layer further comprises one of heating, annealing, performing an ion implantation process on the photoresist layer, and a combination of the forgoing.

4. The method of claim 3 further comprising depositing a metal contact on the substrate to form a semiconductor device in which the graphene or a graphene-like sheet provides a device interconnect.

5. The method of claim 4 wherein the substrate comprises silicon carbide.

6. The method of claim 5 wherein the heating of the photoresist layer further comprises holding a temperature of between about 1200 and about 2000 degrees C. for between about 10 and about 180 minutes.

7. The method of claim 5 wherein the silicon carbide is formed from a zero-degree silicon carbide wafer.

8. The method of claim 7 wherein the heating of the photoresist layer further comprises:
   holding a temperature of between about 80 and about 120 degrees C. for between about 10 and about 20 minutes;
   holding a temperature of between about 300 and about 700 degrees C. for between about 30 and about 120 minutes; and holding a temperature of between about 1200 and about 2000 degrees C. for between about 10 and about 180 minutes.

9. The method of claim 3 further comprising:
depositing a gate over at least a portion of the graphene or a graphene-like sheet;
forming a source and a drain adjacent to the at least a portion of the graphene or a graphene-like sheet; and
depositing metal contacts for the source, the drain, and the gate to form a field-effect semiconductor device.

10. The method of claim 9 wherein the substrate comprises silicon carbide.

11. The method of claim 10 wherein the heating of the photoresist layer further comprises holding a temperature of between about 1200 and about 2000 degrees C. for between about 10 and about 180 minutes.

12. The method of claim 10 wherein the silicon carbide is formed from a zero-degree silicon carbide wafer.

13. The method of claim 12 wherein the heating of the photoresist layer further comprises:
holding a temperature of between about 80 and about 120 degrees C. for between about 10 and about 20 minutes;
holding a temperature of between about 300 and about 700 degrees C. for between about 30 and about 120 minutes; and
holding a temperature of between about 1200 and about 2000 degrees C. for between about 10 and about 180 minutes.

14. A method of fabricating a semiconductor structure, the method comprising:
implanting nitrogen into a silicon carbide substrate to form a buried layer of silicon nitride defining a silicon carbide surface layer;
bonding a support substrate to the silicon carbide surface layer;
separating the silicon carbide surface layer from the silicon carbide substrate and the silicon nitride to form a silicon carbide layer bonded to the support substrate;
creating a photoresist layer on the silicon carbide layer;
energizing the photoresist layer until the photoresist layer forms a graphene or graphene-like layer.

15. The method of claim 14 further comprising removing an amorphous carbon layer formed by the energizing of the photoresist layer to leave the graphene or graphene-like layer.

16. The method of claim 15 wherein the energizing of the photoresist layer further comprises one of heating, annealing, performing an ion implantation process on the photoresist layer, and a combination of the forgoing.

17. The method of claim 16 further comprising depositing metal contacts on the silicon carbide layer to form a semiconductor device in which the graphene or graphene-like layer provides device interconnects.

18. The method of claim 17 wherein the heating of the photoresist layer further comprises holding the semiconductor structure at a temperature of between about 1200 and about 2000 degrees C. for between about 10 and about 180 minutes.

19. The method of claim 18 wherein the separating of the silicon carbide surface layer from the silicon carbide substrate and the silicon nitride further comprises contacting the semiconductor structure with phosphoric acid while holding the semiconductor structure at an elevated temperature.

20. The method of claim 16 further comprising:
depositing a gate over at least a portion of the graphene or graphene-like layer;
forming a source and a drain adjacent to the at least a portion of the graphene or graphene-like layer; and
depositing metal contacts for the source, the drain, and the gate to form a field-effect semiconductor device.

21. The method of claim 20 wherein the heating of the photoresist layer further comprises holding the semiconductor structure at a temperature of between about 1200 and about 2000 degrees C. for between about 10 and about 180 minutes.

22. The method of claim 21 wherein the separating of the silicon carbide surface layer from the silicon carbide substrate and the silicon nitride further comprises contacting the semiconductor structure with phosphoric acid while holding the semiconductor structure at an elevated temperature.

* * * * *

UNITED STATES PATENT AND TRADEMARK OFFICE
CERTIFICATE OF CORRECTION

| | | |
|---|---|---|
| PATENT NO. | : 8,080,441 B2 | Page 1 of 1 |
| APPLICATION NO. | : 12/686066 | |
| DATED | : December 20, 2011 | |
| INVENTOR(S) | : Alexander V. Suvorov | |

It is certified that error appears in the above-identified patent and that said Letters Patent is hereby corrected as shown below:

On the cover page, "(75) Inventor" change "Alexander Suvorov, Durham, NC (US)" to --Alexander V. Suvorov, Durham, NC (US)--

Signed and Sealed this

Seventh Day of February, 2012

David J. Kappos
*Director of the United States Patent and Trademark Office*